SPECTRUM BALANCED MODULATOR

Filed July 28, 1961

INVENTOR.
JOHN E. GARLAND

BY T. L. Styner

ATTORNEY

United States Patent Office 3,184,690

Patented May 18, 1965

3,184,690
SPECTRUM BALANCED MODULATOR

John E. Garland, Rochester, N.Y., assignor to General Dynamics Corporation, Rochester, N.Y., a corporation of Delaware Filed July 28, 1961, Ser. No. 127,720
3 Claims. (Cl. 332—43)

The invention relates to frequency synthesis and is particularly directed to circuits for generating digitally related injection frequencies for heterodyne type communication transmitters or receivers.

In the patent application of Roger R. Bettin et al., Serial No. 42,698, filed July 13, 1960, now Patent No. 3,054,057 issued September 11, 1962, entitled "Digitally Tuned Transmitter-Receiver" and assigned to the assignee of this application, is described a sideband receiver comprising a series of high frequency mixers for successively changing the signal modulated R.F. wave to an ultimate intermediate frequency which can be amplified and detected. Each mixer is followed by a relatively fixedly tuned narrow bandpass filter. Into each mixer is fed a stable locally generated injection frequency, each injection frequency being variable in steps, and the steps of the several injection sources being decimally related. For example, in the first mixer the injection frequency is variable in one megacycle steps, in the second mixer the injection frequency is variable in 100 kc. steps, in the third mixer the injection frequency is variable in 10 kc. steps, and in the fourth mixer the injection frequency is variable in 1 kc. steps. Ten frequency steps are provided for each injection frequency so that any desired R.F. signal may be selected by appropriately positioning a ten-position knob for each injection frequency source. It is important that each of the ten injection frequencies be not only stable in frequency and of uniform spacing but that the injection frequencies be of uniform amplitude.

The object of this invention is to provide an injection frequency which can be varied in at least ten equal steps, the frequency of each step being stable, frequencywise, and of uniform amplitude.

The object of this invention is attained by combining the injection frequency with a spectrum of frequencies in a novel balanced modulator, the spectrum of frequencies containing predominant components with the desired frequency spacing or steps. For example, the injection frequency for the second mixer of the receiver may be 90.65 megacycles and the desired steps uniformly spaced frequencies 100 kc. apart both above and below the 90.65 megacycle frequency. That is, the resulting frequencies at the output of the balanced modulator may be 90.25 to 91.15 megacycles; four of the frequency steps being below and five of the frequency steps being above the injection frequency of 90.65. The amplitude of each of these ten frequencies, including the 90.65 megacycle frequency, is substantially of equal amplitude.

Other objects and features of this invention will become apparent to those skilled in the art by referring to the embodiments of the invention described in the following specification and shown in the accompanying drawing, in which.

Figure 1:
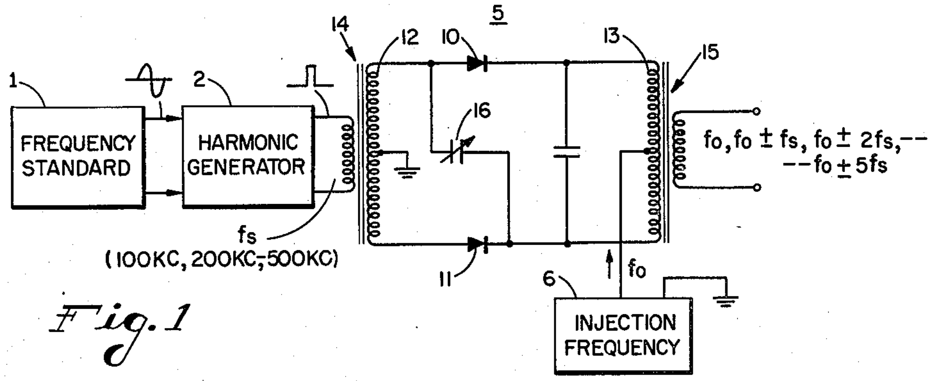
FIG. 1 is a simplified schematic circuit diagram of a balanced modulator of this invention.

In FIG. 1 is shown a system for generating a number of digitally related injection frequencies. The frequency standard 1 may comprise a single crystal accurately ground and temperature stabilized to produce the required narrow-tolerance frequency source. Such a source can be designed to vary less than one part in 100 million per day. The particular frequency standard, which will be referred to throughout this specification by way of example, produces 100 kc. Such a frequency may be, and preferably is, obtained by a frequency division from a higher frequency crystal. Harmonic generator 2 reshapes the standard frequency wave to produce pulses containing strong harmonic components. It has been found that to produce the first five multiples with substantially uniform amplitude, the pulse should be reshaped to have a fast rise time and a somewhat slow decaying trailing edge. Such a pulse shaping circuit produces harmonically related frequencies, which will be referred to hereinafter as $f_s$, $2f_s$, $3f_s$, $4f_s$ and $5f_s$. If $f_s$ is 100 kc., the harmonic frequencies will be 200 kc., 300 kc., 400 kc., and 500 kc.

The $f_s$ spectrum is applied to the modulator 5 along with the carrier frequency $f_0$ of the injection frequency source 6. Source 6 can either be stabilized, or variations from an optimum frequency can be neutralized by an error canceling loop, not shown and not claimed. It will be assumed $f_0$ is stable and, for purposes of example, will be referred to hereinafter as 90.65 megacycles. Hence, ten frequencies uniformly spaced 100 kc. will appear in the output of the modulator from 90.25 mc. to 91.15 mc.

The modulator 5 shown in simplified form in FIG. 1 is of the balanced type comprising, in the embodiment shown in FIG. 1, a center tapped output transformer winding 13 and an input center tapped transformer winding 12. Corresponding terminals of the windings are coupled through nonlinear impedance devices shown, in this example, as diodes 10 and 11. The signal voltage $f_s$ is applied through transformer 14 in push-pull to the windings so that the signal voltage appears in phase opposition across the nonlinear impedance devices 10 and 11. The injection or carrier frequency, however, is applied in phase across the nonlinear devices 10 and 11, the particular connections shown comprising the center tap of winding 13 and the grounded center tap of winding 12 coupled across the carrier frequency source. With the system symmetrical and balanced, as shown, the phase relations are such that signal and carrier components appear across the diodes and across the winding 13 but with no carrier voltage present in the output. That is, only upper and lower sideband components appear in the output, the carrier components of the modulation products being canceled because these components appear in time phase at opposite ends of output winding 13. If the various harmonic components of the signal frequency $f_s$ are of substantially uniform amplitude at the input of the modulator, the corresponding sideband components of both upper and lower sidebands will appear with substantially uniform amplitude in the output circuit 15.

Figure 3:
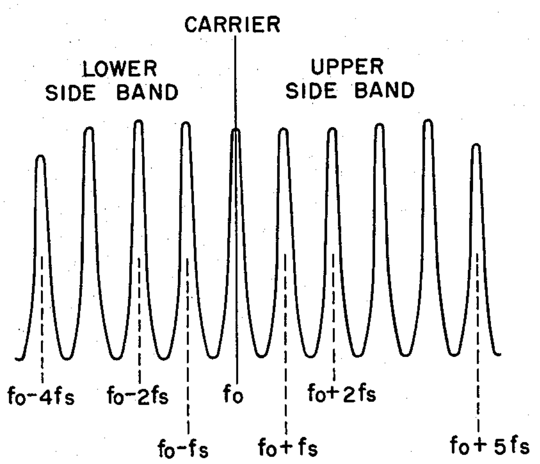
FIG. 3 is the waveform diagram of the output of the modulator of FIG. 2.

But, it is desired, now, that the carrier, which is normally completely suppressed, be made to appear in the output circuit with an amplitude substantially equal to the amplitude of the sidebands. According to an important and characteristic feature of this invention, the normally balanced modulator of FIG. 1 is controllably unbalanced for the carrier frequency. Unbalancing is accomplished by causing unlike amounts of carrier current to flow through the nonlinear impedance devices 10 and 11. Specifically, in FIG. 1, unbalancing is accomplished by by feeding an adjustable amount of carrier component from the output of one nonlinear device to the input of the other nonlinear device. In the example of FIG. 1, adjustable condenser 16 is connected between the output terminal of diode 11 and the input terminal of diode 10. Asymmetry for the carrier in the normally balanced circuit could be effected in various other ways. For example, a variable bypass condenser could be shunted directly across one of the diodes 10 or 11. The carrier component will accordingly appear at one terminal of winding 13 without a corresponding in-phase component at the other terminal. It is a simple matter to adjust the amount of carrier feedback so that the carrier amplitude in the output circuit is equal to the amplitude of the sideband components. Accordingly, in the output appear frequencies $f_o$, as well as sidebands $f_o \pm f_s$, $f_o \pm 2f_s$ . . . $f_o \pm nf_s$. The composite waveform of the output circuit is shown in FIG. 3. Since ten output frequencies uniformly spaced are desired, it is preferred that four of the lower sideband frequencies be combined with the carrier and five upper sideband frequencies, as shown.

Figure 2:
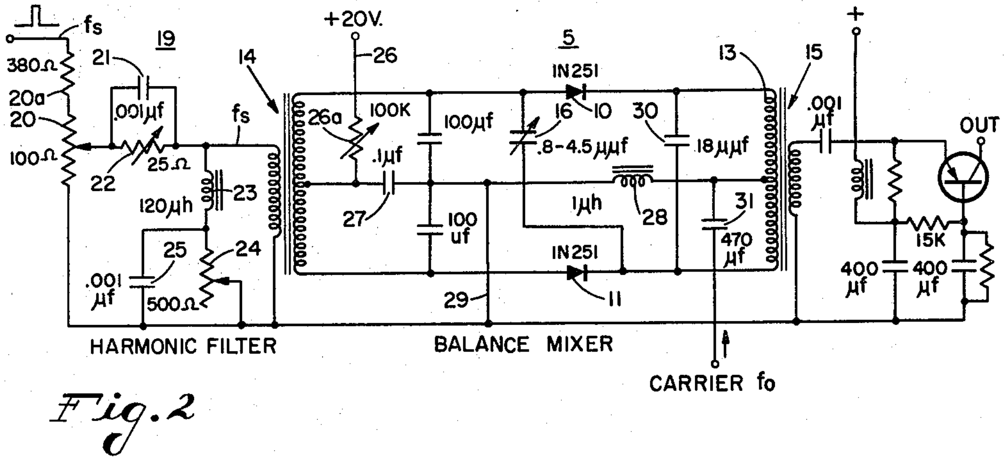
FIG. 2 is a complete circuit diagram corresponding in function with the balanced modulator of FIG. 1.

Specific circuits found to produce the results of FIG. 3 are shown in some detail in FIG. 2. Square pulses of 100 kc. are applied to the harmonic filter 19 for selecting the desired multiples, of uniform amplitude, of the 100 kc. Although a square pulse contains all harmonics, the harmonics of higher order rapidly decrease in amplitude. The harmonic filter 19 shown selects the first to the fifth harmonic and applies those frequencies with substantially uniform amplitude to the primary of transformer 14. The filter consists essentially of the series condenser 21 and the shunt condenser 25 for attenuating the various harmonic frequencies in the proper proportions to produce uniform amplitudes. For this purpose, resistors 22 and 24 across condenser 21 and 25, respectively, regulate the Q of the condensers. Choke coil 23 reduces the attenuation of the higher frequencies in the shunt circuit. That is, series condenser 21 selectively passes the higher harmonics to the transformer 14 while shunt choke 23 and condenser 25 variably adjusts the amplitude of the lower ordered harmonics. The overall amplitude of the harmonic signals is regulated by potentiometer 20–20*a*. As indicated above, the 100 kc. frequency and the first five harmonics applied across the primary of transformer 14 may be made of substantially uniform amplitude by appropriately adjusting the specific values of the series and shunt elements of the harmonic filter. It might be found desirable in a particular circuit to empirically modify the pulse shaping components so as to cause the second, third, fourth and fifth harmonics to progressively increase slightly to compensate for the fall off of the 90.25 to 91.15 mc. frequencies in the transformer 15.

The diodes 10 and 11 are forwardly biased by source 26 so that the input signals appear at the output of the balanced bridge without clipping. By making the biasing voltage variable, as with variable resistance 26*a*, the forward resistance of the diode can be varied and the flatness and amplitude of the output spectrum adjusted. Choke coil 28 and ground connection 29 complete the D.C. biasing circuit. D.C. blocking condenser 27 passes the signal frequency. The output transformer 15 is tuned to the carrier frequency by condenser 30. The carrier $f_o$ is applied to the center tap of the transformer winding 13 through coupling condenser 31. While the unbalancing condenser 16 is shown coupled between the output of diode 11 and the input of diode 10, this condenser could, with equal facility, be coupled between the input of diode 11 and the output of diode 10. With components of the particular values indicated on the drawings and with the diodes of the type shown and with the frequencies indicated, the output carrier and sideband amplitudes were of substantially uniform amplitude, as shown in FIG. 3. Any one of these sideband or carrier frequencies can be easily selected at the output terminals of the system. Since the carrier and sideband amplitudes are of uniform value, any one of the ten frequencies may be selected and injected in the heterodyne signal circuits of a single sideband receiver to tune the receiver in 100 kc. steps. To reduce spurious mixer products in the receiver, the output of the modulator of this invention is preferably combined with an adjustable oscillator and narrow band filter, not shown, before application to the receiver mixer.

Many modifications of the circuit of FIG. 2 may be made without departing from the scope of this invention.

What is claimed is:

1. A frequency synthesizer comprising a high carrier frequency source, means for modulating the carrier of said source with a plurality of decimally-related signal frequencies to produce simultaneously in an output circuit said carrier and a succession of sideband frequencies uniformly spaced above and below said carrier and of substantially uniform amplitude, said means comprising a center tapped output transformer winding, two nonlinear impedance devices connected, respectively, to the terminals of said winding transformer, a source of said signal frequencies coupled in push-pull relation to said impedance devices to apply the signal voltage in phase opposition to said winding transformer terminals, said carrier source being coupled to the center tap of said transformer to apply balanced quantities of said carrier in phase across said impedance devices to generate modulation sideband components with suppressed carrier in said output transformer, and adjustable impedance means connected between one terminal of said output transformer and one terminal of said input transformer for controllably unbalancing said modulator for said carrier to generate a carrier component of said substantially uniform amplitude in said output transformer.

2. In combination in a balanced modulator, a center tapped input transformer winding, a center tapped output transformer winding, a first and a second nonlinear impedance device coupled, respectively, between corresponding end terminals of said windings, a carrier source coupled between the center taps of said windings, a signal source coupled across said input transformer winding so that signal currents flow in phase opposition through said impedance devices and so that carrier currents flow in phase through said impedance devices to produce in said output transformer winding sideband modulation products of predetermined amplitude without a carrier component, and means for producing a carrier component in said output transformer winding of said predetermined amplitude comprising an adjustable condenser connected from one winding terminal to the opposite terminal of the other winding.

3. In combination in a balanced modulator, a center tapped input transformer winding, a center tapped output transformer winding, a first diode connected between corresponding first terminals of said windings, a second diode coupled between the remaining terminals of said windings, a carrier frequency source coupled between said center taps, a signal source coupled in push-pull across one winding, and a condenser of predetermined capacity coupled between the anode terminal of one diode and the cathode terminal of the other diode for producing a carrier frequency voltage of predetermined level across the terminals of said output transformer winding.

References Cited by the Examiner

UNITED STATES PATENTS

| | | | |
|---|---|---|---|
| 2,738,462 | 3/56 | Troxel | 331—40 X |
| 2,955,266 | 10/60 | Glasspool | 332—47 |

ROY LAKE, *Primary Examiner.*

ARTHUR GAUSS, *Examiner.*